United States Patent [19]

Hey-Shipton et al.

[11] Patent Number: 5,618,777

[45] Date of Patent: Apr. 8, 1997

[54] HIGH TEMPERATURE SUPERCONDUCTOR LUMPED ELEMENTS AND CIRCUIT THEREFROM

[75] Inventors: Gregory L. Hey-Shipton; Roger J. Forse, both of Santa Barbara; David L. Skoglund, Mountain View, all of Calif.

[73] Assignee: Superconductor Technologies, Inc., Santa Barbara, Calif.

[21] Appl. No.: 70,100

[22] Filed: May 28, 1993

[51] Int. Cl.$^6$ .............................. H03H 7/01; H01B 12/06
[52] U.S. Cl. ................ 505/210; 333/99 S; 333/185; 336/DIG. 1; 505/211; 505/700; 505/701; 505/866; 505/705
[58] Field of Search .................. 333/99 S, 185; 505/1, 700, 701, 705, 866, 210, 204, 211; 336/DIG. 1

[56] References Cited

U.S. PATENT DOCUMENTS

| | | | |
|---|---|---|---|
| 4,881,050 | 11/1989 | Swanson, Jr. | 333/185 |
| 4,981,838 | 1/1991 | Whitehead | 333/99 S X |
| 5,023,578 | 6/1991 | Kaneko | 333/185 |
| 5,175,518 | 12/1992 | Swanson, Jr. | 333/168 |
| 5,231,078 | 7/1993 | Riebman et al. | 333/99 S X |
| 5,329,225 | 7/1994 | Roshen et al. | 333/99 S X |

FOREIGN PATENT DOCUMENTS

| | | | |
|---|---|---|---|
| 357507 | 3/1990 | European Pat. Off. | 505/701 |
| 33702 | 2/1985 | Japan | 333/185 |
| 84703 | 3/1985 | Japan | 505/705 |
| 74705 | 3/1989 | Japan | 505/705 |
| 101716 | 4/1989 | Japan | 333/185 |
| 205904 | 9/1991 | Japan | 333/157 |
| 5029154 | 2/1993 | Japan | 336/DIG. 1 |

OTHER PUBLICATIONS

S. Gibilisco et al, Editors, Encyclopedia of Electronics, 2nd Ed., p. 531 1990, McGraw Hill, Inc. Publishers.

Schmidt et al, "Measured Performance at 77K of Superconducting Microstrip Resonators and Filters", Sep., 1991, IEEE Transactions on Microwave Theory and Technique, vol. 39, No. 9, pp. 1475–1479.

Talisa et al, "Low– and High–Temperature Superconducting Microwave Filters", Sep. 1991, IEEE Transactions on Microwave Theory and Technique, vol. 39, No. 9, pp. 1448–1454.

*Primary Examiner*—Benny T. Lee
*Attorney, Agent, or Firm*—Lyon & Lyon

[57] ABSTRACT

Lumped element electrical components, such as inductors and capacitors, are formed to include high temperature superconducting materials. In the preferred embodiment, thin film epitaxial high temperature superconductors are patterned to form capacitors and inductors on low loss substrates. Preferably, a ground plane is formed on the back side of the substrate, most preferably being formed of high temperature superconducting material, or other highly conductive materials such as gold or copper. Various advantageous structures include a planar spiral structure, a zig-zag serpentine structure, a single coil structure and a double coil structure. Single layer and multilayer structures are included. Improved narrow bandpass filters and high Q resonator structures are formed.

35 Claims, 5 Drawing Sheets

HIGH TEMPERATURE SUPERCONDUCTOR LUMPED ELEMENTS AND CIRCUIT THEREFROM

FIELD OF THE INVENTION

This invention relates to electrical circuits including lumped elements, especially inductors and capacitors. More particularly, it relates to microwave circuits such as filters which include some superconducting components.

BACKGROUND OF THE INVENTION

Electrical components come in various conventional forms, such as inductors, capacitors and resistors. A lumped electrical element is one whose physical size is substantially less than the wave length of the electro-magnetic field passing through the element. A distributed element is one whose size is larger than that for a lumped element. As an example, a lumped element in the form of an inductor would have a physical size which is a relatively small faction of the wave length used with the circuit, typically less than ⅛ of the wavelength.

Inductors, capacitors and resistors have been grouped together into useful circuits. Useful circuits including those elements include resonant circuits and filters. One particular application has been the formation of filters useful in the microwave range, such as above 500 MHz.

Considering the case of conventional microwave filters, there have been basically three types. First, lumped element filters have used separately fabricated air wound inductors and parallel plate capacitors, wired together into a filter circuit. These conventional components are relatively small compared to the wave length, and accordingly, make for a fairly compact filters. However, the use of separate elements has proved to be difficult in manufacture, and resulting in large circuit to circuit differences. The second conventional filter structure utilizes mechanical distributed element components. Coupled bars or rods are used to form transmission line networks which are arranged as a filter circuit. Ordinarily, the length of the bars or rods is ¼ or ½ of the wave length at the center frequency of the filter. Accordingly, the bars or rods can become quite sizeable, often being several inches long, resulting in filters over a foot in length. Third, printed distributed element filters have been used. Generally they comprise a single layer of metal traces printed on an insulating substrate, with a ground plane on the back of the substrate. The traces are arranged as transmission line networks to make a filter. Again, the size of these filters can become quite large. The structures also suffer from various responses at multiples of the center frequency.

Various thin-filmed lumped element structures have been proposed. Swanson U.S. Pat. No. 4,881,050, issued Nov. 14, 1989, discloses a thin-film microwave filter utilizing lumped elements. In particular, a capacitor $\pi$ network utilizing spiral inductors and capacitors is disclosed. Generally, a multilayer structure is utilized, a dielectric substrate having a ground plane on one side of the substrate and multiple thin-filmed metal layers and insulators on the other side. Filters are formed by configuring the metal and insulation layers to form capacitive $\pi$-networks and spiral inductors. Swanson U.S. Pat. No. 5,175,518 entitled "Wide Percentage Band With Microwave Filter Network and Method of Manufacturing Same" discloses a lumped element thin-film based structure. Specifically, an alumina substrate has a ground plane on one side and multiple layer plate-like structures on the other side. A silicon nitride dielectric layer is deposited over the first plate on the substrate, and a second and third capacitor plates are deposited on the dielectric over the first plate.

Historically, such lumped element circuits were fabricated using normal, that is, non-superconducting materials. These materials have an inherent loss, and a result, the circuits have various degree of lossiness. For resonant circuits, the loss is particularly critical. The Q of a device is a measure of its power dissipation or lossiness. Resonant circuits fabricated from normal metals have Q's at best on the order of a few hundred.

With the discovery of high temperature superconductivity in 1986, attempts have been made to fabricate electrical devices from these materials. The microwave properties of the high temperature superconductors has improved substantially since their discovery. Epitaxial superconductive thin films are now routinely formed and commercially available. See, e.g., R. B. Hammond, et al., "Epitaxial $Tl_2Ca_1Ba_2Cu_2O_8$ Thin Films With Low 9.6 GHz Surface Resistance at High Power and Above 77 K", Appl. Phy. Lett., Vol. 57, pp. 825–27, 1990. Various filter structures and resonators have been formed. Other discrete circuits for filters in the microwave region have been described. See, e.g., S. H. Talisa, et al., "Low-and High-Temperature Superconducting Microwave Filters," IEEE Transactions on Microwave Theory and Techniques, Vol. 39, No. 9, September 1991, pp. 1448–1554.

The need for compact, reliable narrow band filters has never been stronger. Applications in the telecommunications fields are of particular importance. As more users desire to use the microwave band, the use of narrow band filters will increase the number of users in the spectrum. The area from 800 to 2,000 MHz is of particular interest. In the United States, the 800 to 900 Mhz range is used for analog cellular communications. The personal communications services are planned for the 1,800 to 2,000 MHz range.

Despite the clear desirability of improved electrical circuits, including the known desirability of converting circuitry to include superconducting elements, efforts to date have been less than satisfactory in all regards. It has proved to be especially difficult in substituting high temperature superconducting materials to form circuits without severely degrading the intrinsic Q of the superconducting film. These problems include circuit structure, radiative loss and tuning and have remained in spite of the clear desirability of an improved circuit.

SUMMARY OF THE INVENTION

Novel lumped element inductors and capacitors are formed from high temperature superconducting materials alone or in combination with conventional materials. In the preferred embodiment, thin-film epitaxial high temperature superconductors are patterned to form lumped capacitors and inductors on low loss substrates. These include all those compatible with the formation of high temperature superconducting films (e.g., lanthanum aluminate, sapphire and magnesium oxide).

Various novel and advantageous structures are described. A planar spiral inductor comprises a spiral with the ends providing the circuit contacts. The planar spiral inductor may be formed from anywhere from a fraction of a turn to many turns. If necessary, a crossover may be provided from the inner end of the spiral to circuitry outside of the spiral inductor. The spiral inductor may be formed of any geometric shape, in the preferred embodiments being either circular or rectangular in construction.

A zig-zag inductor is formed from high temperature superconducting films. The pattern is formed in a meandering or serpentine pattern. Advantageously, this structure would not ordinarily require a crossover to provide connection at both ends of the lumped element. This structure has the added benefit that the opposing currents in adjacent sections of the inductor greatly reduce any losses due to radiative effects.

A double coil inductor is formed from high temperature superconducting materials. The inductor is formed surrounding a first input end and surrounds the output end of the inductor. The inductors portions may be formed in any shape desired, in the preferred embodiment being formed in a rectangle or circular form.

A single coil inductor structure utilizes solely high temperature superconducting materials. One end of the lumped element inductor is encircled by the inductor. The other end of the inductor is provided as an output contact.

Multi-layer structures utilize a high temperature superconductor film with coupling to the inductor via a multi-level structure. Capacitive coupling sections may be formed from normal metal for high temperature superconductor.

High Q structures may be formed with the disclosed devices. Resonators with Q greater than 1,000 are easily achievable. Further, narrow bandpass filters are conveniently formed.

Accordingly, it is an object of this invention to provide novel and highly advantageous structures for lumped element inductors and capacitors.

It is yet a further object of this invention to provide for lumped elements formed of high temperature superconductor materials, with or without the inclusion of normal metals.

It is yet a further object of this invention to provide for improved filters.

It is another object of this invention to provide for improved narrow bandpass filters for use in telecommunications.

It is yet a further object of this invention to provide lumped elements useful for high Q circuits.

It is yet a further object of this invention to provide structures which preserve the low loss nature of high temperature superconductors yet perform valuable electrical functions as inductors and capacitors.

BRIEF DESCRIPTION OF THE DRAWINGS

FIG. 8A shows a cross-section of FIG. 8 at A–A'.

FIG. 9A shows a cross-section of FIG. 9 at B–B'.

DETAILED DESCRIPTION OF THE INVENTION

Figure 1:
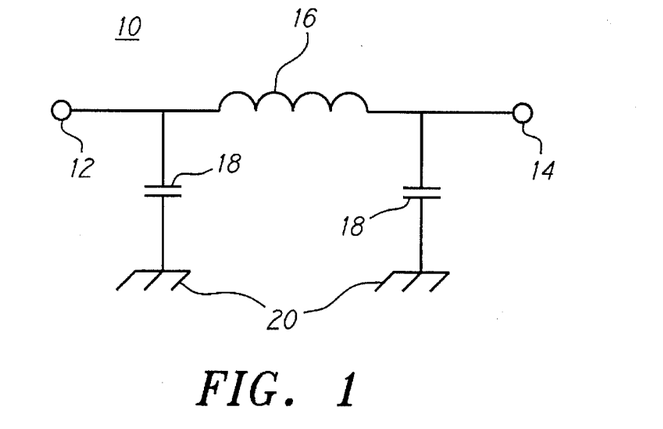
FIG. 1 shows a circuit diagram of a $\pi$ network.

FIG. 1 shows an electrical circuit for a $\pi$ network 10. One or more $\pi$ networks 10 may be combined as known to those skilled in the art. Generally, there is an input node 12 and an output node 14. An inductor 16 couples the input node 12 to the output node 14. The positive coupling to ground is performed by capacitors 18 coupling the ends of inductor 16 to the ground 20.

Any of the structures described herein may be formed using any type of superconducting materials. Preferably, high temperature superconducting materials, i.e., those which superconduct at or above 77 K. The preferred materials are epitaxial superconductors, with low loss in the microwave and radio frequency range. Preferred superconductors include the thallium containing superconductors, which generally include thallium, optionally calcium, barium and copper oxide, or the YBCO superconductors which are based on yttrium.

Figure 2:
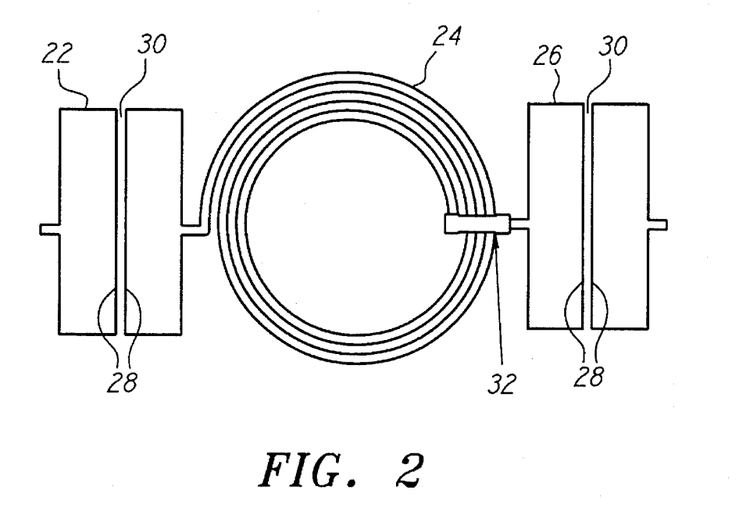
FIG. 2 shows a plan view of a multi-turn planar spiral inductor.

FIG. 2 shows a plan view of a multi-turn planar spiral inductor in accordance with this invention. Input capacitor 22 connects to spiral inductor 24 and provides output to capacitor 26. In the preferred embodiment, the capacitors 24 and 26 are formed from thin-film high temperature superconducting materials. The capacitors 22 and 24 are formed by the coupling capacitance between the simple pad structures shown. However, they may be of any desired shape as known to those in the art, such as planer, inter-digital or multi-layers structures. Adjacent faces 28 define a gap 30 defining the space between the capacitor plates. Optionally, dielectric material may be placed in the gap 30. In the preferred embodiment, no additional material is provided between the faces 28. The inductor 24 is preferably formed from a thin-film epitaxial superconductor. The inductor 24 may be patterned with anywhere from a fraction of a turn to many turns. The spiral may continue optionally through to the center of the spiral.

While FIG. 2 shows a circular or spiral arrangement, the shape of the inductor may be of any form, with the preferred forms being spiral or rectangular. Connection to the inductor 24 may be direct, or as desired, via a crossover 32. The crossover 32 provides a connection from one end of the inductor 24 to the output capacitor 26. The crossover 32 may be formed through any conventional technique such as by utilizing normal metal bonding wires, metal air or dielectrically supported bridges, or multi-layer high temperature superconductor crossovers. Additionally, all high temperature superconducting crossovers are possible via formation of crystal defects in the superconductor so as to render the material locally non-superconductive. See, e.g., "Superconducting Thin Film Crossovers and Method", application Ser. No. 07/917,175, filed Jul. 20, 1992, now abandoned, incorporated herein by reference.

The structure of FIG. 2 shows an inductor 24 having 2.5 turns. In one actual device, the line width is 50 microns, the line spacing is 20 microns, resulting in a total inductance of about 18.6 nanoHenries at 0.85 GHz. The resistance of the high temperature superconductor line was about 1.2 milliOhms. In the preferred embodiment, the crossover 32 is formed using high temperature superconductor, such as multi-layer crossover structure. Performing the crossover from normal metals, such as gold or copper, the added inductor loss from the crossover together with the resistance of the contact resistance to the film can be relatively large. At this frequency, a 1 mil diameter bond wire can add an extra 10 milliOhms to the overall inductor loss. Accordingly, high temperature superconductor crossover 32 is preferred.

The structure of FIG. 2 is formed on a substrate. Preferably, the substrate should be chosen from the group of substrates that are compatible with the growth of low loss, high temperature superconducting films, including lanthanum aluminate, sapphire and magnesium oxide. Thallium containing superconductors formed on Lanthanum Aluminate provide good results. Films of thallium on lanthanum aluminate are commercially available. The backside of the substrate, that is, the side opposite that on which the capacitors 22 and 26 and inductor 24 have been formed, is preferably formed into a ground plane. In the most preferred embodiment, the ground plane comprises a high temperature superconductor plane. Optionally, the ground plane may be formed of normal metal, such as gold or high quality copper, though with some degradation in performance.

The self resonant frequency for the structure of FIG. 2 is four times higher than its operating frequency. Accordingly, this structure is particularly useful for simple filter structures. Other filter structures which have finite frequency transmission poles, such as elliptic type filters, can use the self-resonance property of these inductors in the filter design. Very selective filters may be constructed without the addition of additional elements.

Figure 3:
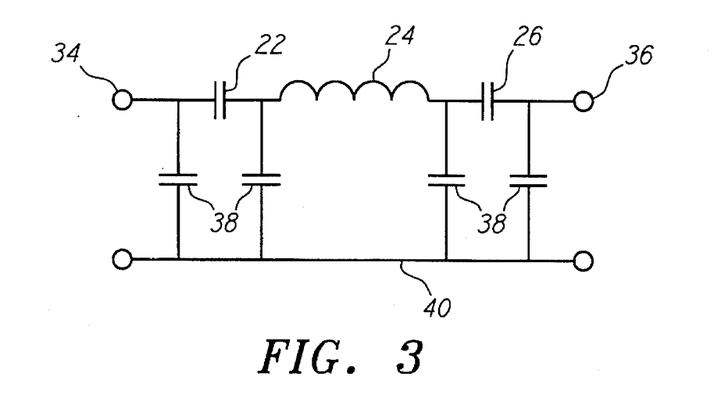
FIG. 3 shows a circuit component representation of the structure of FIG. 2.

FIG. 3 shows a circuit diagram of the structure of FIG. 2. Input 34 is connected to capacitor 22. The output 36 is connected to capacitor 26. Inductor 24 is connected to capacitor 22 and capacitor 26 which couples to input 34 and output 36 respectively. Capacitor 38 represents the capacitance between the circuit elements and the ground plane represented as line 40.

Figure 4:
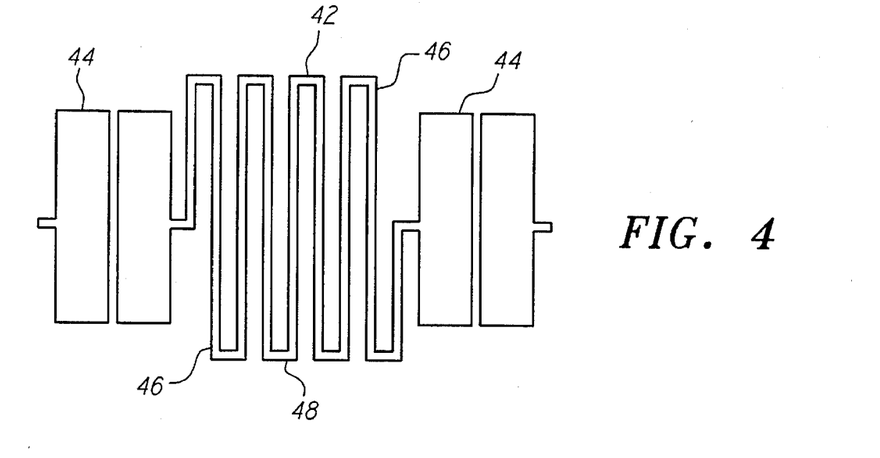
FIG. 4 shows a plan view of a zig-zag inductor.

FIG. 4 shows a plan view of a zig-zag type inductor. The inductor 42 is shown coupled to capacitor 44. The capacitor structure is as described in connection with FIG. 2 and need not be repeated here. The inductor 42 may be formed in any serpentine or zig-zag manner. Generally, long runs 46 of the inductor 42 are parallel to one another. End portions 48 provide the continuous path between runs 46. The structure of FIG. 4 generally would not require a crossover, such as shown as crossover 32 in FIG. 2. Accordingly, such a structure as shown in FIG. 4 has a much higher Q than all the other structures due to the serpentine nature of the structure and the lack of a crossover connection. Generally, this structure is particularly beneficial for low loss narrow band circuits where out of band performance is not overly critical. Particular applications include elliptical filters where self-resonance can be used to accurately place finite frequency poles of very high Q in a filter response.

The structure of FIGS. 4 through 7 are generally as described with respect to FIG. 2 and will not be repeated in detail here. Generally, the structure is formed preferably from patterned thin-film high temperature superconductors formed on a substrate. A ground plane is provided on the backside of the substrate, preferably formed of high temperature superconductor or normal metals suitable for radio frequency or microwave application, such as gold or high quality copper.

Figure 5:
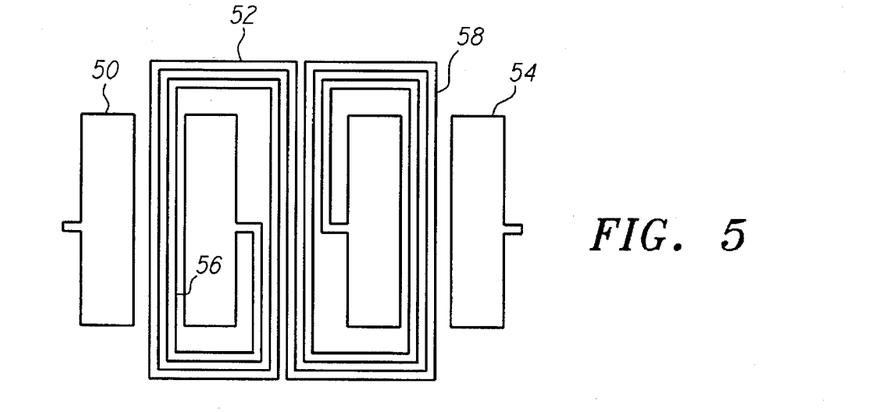
FIG. 5 shows a plan view of a double coil inductor.

FIG. 5 shows a plan view of a double coil inductor. A first input capacitor 50 is coupled to the conductor 52, which is in turn coupled to the output capacitor 54. As described in connection with the structure of FIG. 2, the capacitors 50 and 54 may be of any desired shape, such as pad shaped, planar, inter-digital or multi-layer structure. The inductor 52 of FIG. 5 runs around one plate of the capacitor 50, through the gap 56. One or more passes through the gap 56 may be made as desired. The inductor 52 circumscribes one plate of output capacitor 54. Again, the inductor 52 may circumscribe the output capacitor via the gap 58 one or more times. The structure of FIG. 5 is particularly useful for high performance, narrow band filters which do not require strong coupling between adjacent resonators. Preferably, no crossovers are used, and accordingly, particularly higher Q's are available compared to structures in which crossovers are used. The structure of FIG. 5 may exhibit destructive coupling, and generally has a high self-resonance and high inductance per unit area. Again, the inductor 52 may be formed in any looping manner, with the preferred structure being rectangular or circular in form.

Figure 6:
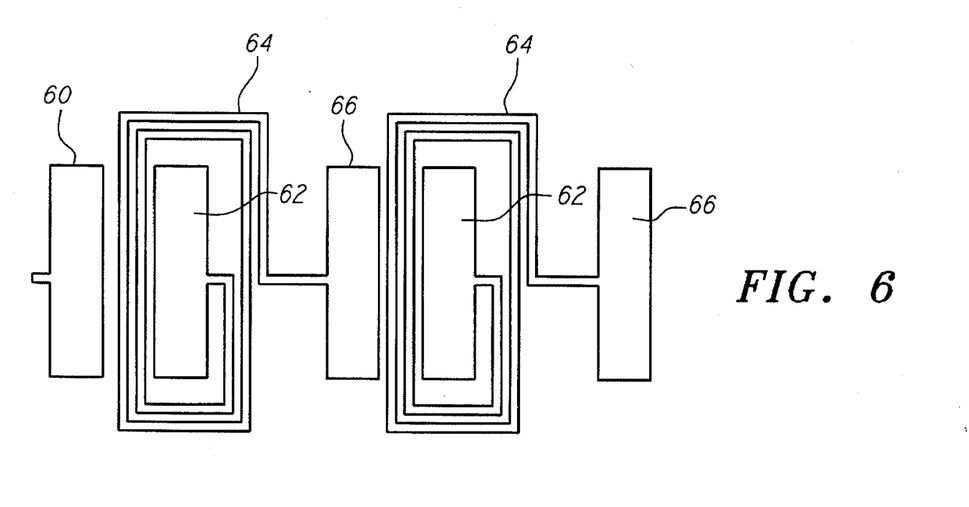
FIG. 6 shows a plan view of a single coil inductor.

FIG. 6 shows a plan view of a single coil inductor in a symmetric mode. An input pad 60 may form one plate of a capacitor in any desired form, such as described in connection with FIG. 2. The pad 62 forms the other plate of the capacitor and provides connection to the inductor 64. Inductor 64 loops between the pad 60 and the pad 62. One or more loops may be made through the gap. The inductor 64 is connected to output pad 66. The inductor 64 may be formed in a looping manner, in the preferred embodiment being either rectangular or circular. The single coil symmetric inductor structure as described may be replicated again. As shown, the output pad 66 also provides the input pad function for the single coil inductor structure shown to the right. The same numerals are used to describe the corresponding elements in the right-hand single coil inductor structure. The single coil inductor structure is well suited for higher frequencies, which generally require lower inductance, and narrow band widths that have low adjacent coupling between resonators.

Figure 7:
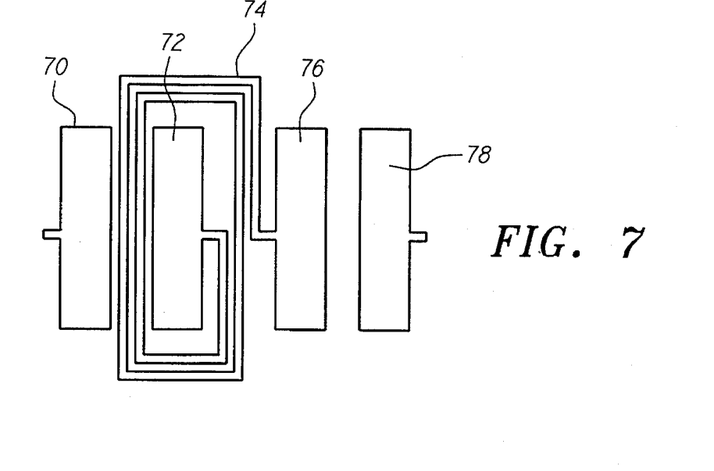
FIG. 7 shows a plan view of an anti-symmetric single coil inductor structure.

FIG. 7 shows a plan view of a single coil inductor structure in an anti-symmetric mode. An input pad 70 couples to corresponding pad 72 which may be formed in any desired manner, such as pad structure, plate structure, inter-digital structure or multi-layer structure. The inductor 74 connects from pad 72 to output pad 76. One or more coils of the conductor may pass between input pad 70 and pad 72. The structure may be in any pattern desired, preferred embodiments are circular or rectangular. The output pad 76 optionally couples to pad 78 to form an output capacitor.

Figure 8:
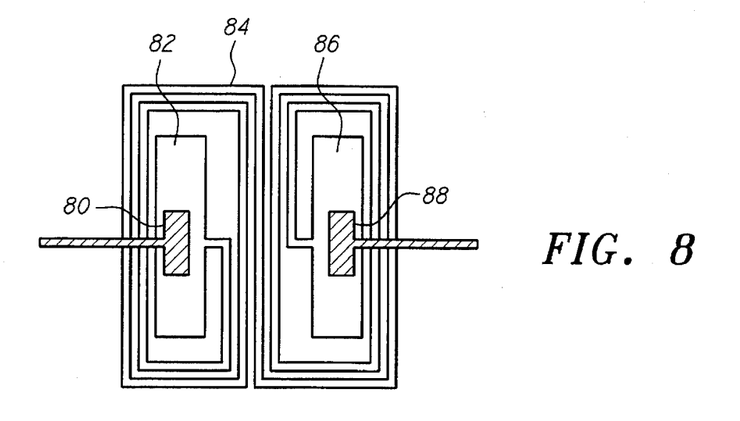
FIG. 8 shows a plan view of a multi-layer resonator structure.

FIG. 8 shows a plan view of a multi-layer resonator structure and FIG. 8A shows a cross section of FIG. 8 at A14 A'. An input pad 80 couples to a pad 82 through intermediate dielectric 81 in FIG. 8A and FIG 8A. As shown in FIGS. 8, 8A, the input pad 80 may be of an desired type, in the preferred embodiment being rectangular. The pad 82 provides the corresponding pad for the input capacitor structure. The inductor 84 couples to the pad 82 and then encircles the pad 82. One or more turns of the inductor 84 may be made around the pad 82 as desired. The inductor 84 is then preferably wound around the pad 86. The turns around the pad 82 and 86 may be of any desired shape, but in the preferred embodiment of rectangular or circular. The pad 86 then provides output to output pad 88 through a dielectric 81 in FIG. 8A. The dielectric material may be any compatible with the other materials utilized for forming the structure of FIGS. 8, 8A. Preferably, the dielectric is chosen from the group: lanthanum aluminate, sapphire, magnesium oxide, any metal fluoride, spinel, ceria, strontium titanate, barium titanate and polyimide.

Figure 9:
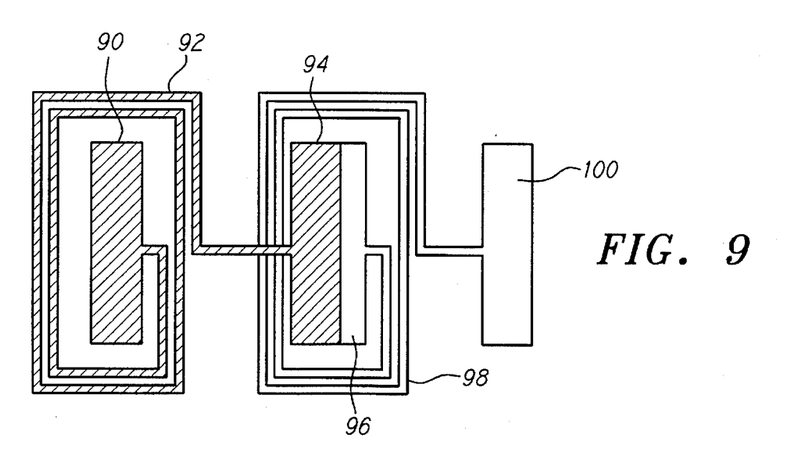
FIG. 9 shows a plan view of a multi-layer high temperature superconductor resonator structure.

FIG. 9 shows a plan view of a multi-layer all high temperature superconductor resonator structure and FIG. 9B shows cross-section of FIG. 9 at B–B'. Input pad 90 connects to inductor 92 which loops around the input pad 90. One or more turns may be formed. While any looping arrangement is possible, the preferred structures are circular or rectangular. The inductor 92 terminates at pad 94. The pad 94 couples to pad 96 with intermediate dielectric 91 in FIG. 9A. Pad 96 connects to inductor 98, inductor 98 circling the pad 96. One or more turns may be used as desired. Again, while any pattern may be used, circular or rectangular patterns are preferred. The inductor 98 connects to output pad 100. Structurally, the pad 90, inductor 92 and output pad 94 may be formed from one thin-film superconducting sheet. This may be backed upon a substrate 93 in FIG. 9A. The substrate preferably has a ground plane 95 (see FIG. 9A) on its backside formed preferably of high temperature superconductor or optionally conventional metal forming a good conductor. The pad 96, inductor 98 and output pad 100 are preferably formed from thin-film superconductor on another layer, separated by a dielectric from the first layer, or on a separate substrate 97 in FIG. 9A. The two patterns are then held in opposition to one another to form the plan view structure shown in FIG. 9.

The multi-layer structures of FIGS. 8, 8A, 9 and 9A may optionally utilize normal metals for one of the planes. The structures of FIGS. 8, 8A, 9 and 9A do not generally require interconnection between layers. Since physical interconnection is not required, the circuit will most likely have higher quality than circuits requiring interconnection. Generally, the structures are most advantageously used for wider band filters where the series capacitance of the elements is often required to be larger than the shunt capacitance.

Figure 10:
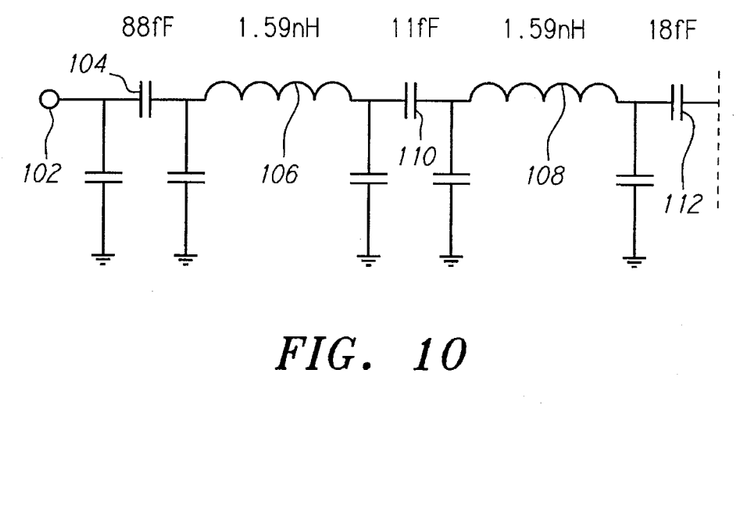
FIG. 10 shows a schematic circuit for a lumped element filter.

FIG. 10 shows a electrical circuit diagram for a 10 GHz thin-film lumped element high temperature superconductor filter. The basic pattern consists of multiple π capacitor networks in series. Capacitive coupling is provided between the various π network portions. Input 102 is connected via input capacitor 104 to first π network 106. A second π network 108 is connected in series via the capacitor 110. Output capacitor 112 may then couple to yet further π networks as desired. In the 10 GHz filter, the input capacitor 104 had a capacitance of 88 femtoFarads, the inductance of the π networks was 1.59 nanoHenries. The coupling capacitor 110 had a capacitance of 11 femtoFarads. The output capacitor 112 had a capacitance of 18 femtoFarads.

Figure 11:
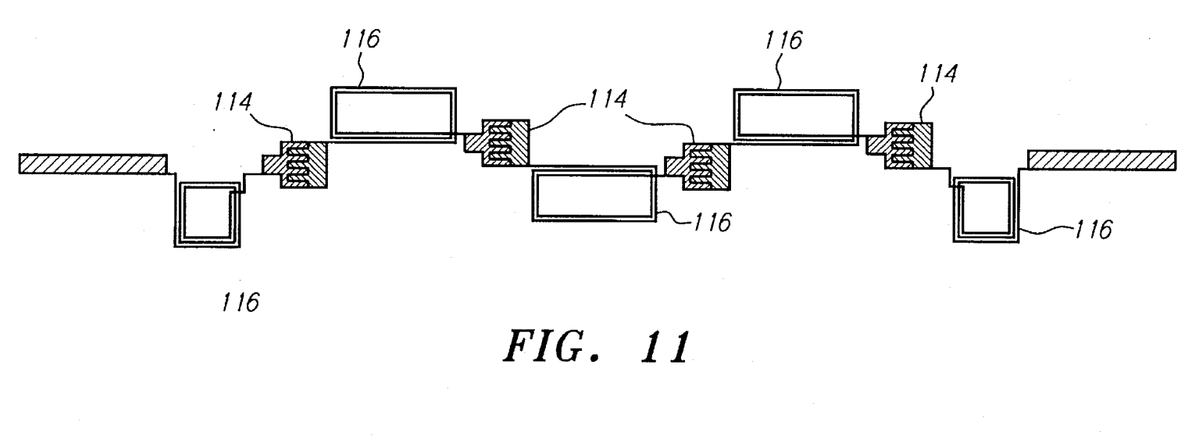
FIG. 11 shows a plan view of a filter circuit similar to that of FIG. 10.

FIG. 11 shows a plan view of a filter circuit, similar to that shown in the schematic in FIG. 10. Capacitors 114 use an inter-digital structure. Inductors 116 are rectangular in shape and comprise multiple turns. Non-superconducting crossovers are provided for inductors 116. The film was patterned from superconductor on a lanthanum aluminate substrate with an assumed relative dielectric constant of 24.

Figure 12:
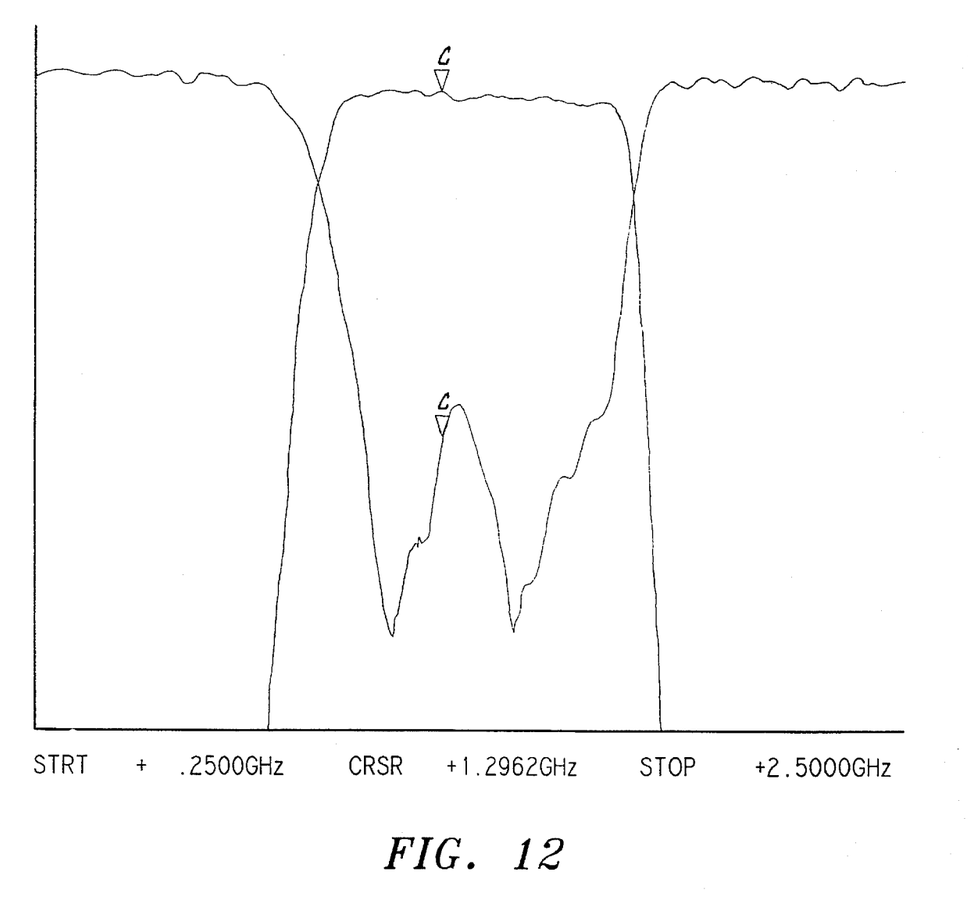
FIG. 12 shows the insertion loss and return loss as a function of frequency for the circuit of FIG. 11.

FIG. 12 shows the insertion loss and return loss as a function of frequency of the filter shown in FIG. 11. The insertion loss curve in FIG. 12 is plotted at 1 dB per division and shows a minimum insertion loss of about 0.2 dB. The return loss curve in FIG. 12 is plotted at 5 dB per division and shows better than 20 dB return loss over the passband of the filter.

EXPERIMENTAL RESULTS

Various structures described above have been fabricated and tested. The results are reported here.

The planar spiral structure of FIG. 2 was formed using a double sided thin-filmed superconductor on lanthanum aluminate. The coil was spiraled. Two and one half turns were used. The unloaded Q of the circuit was 3,215. The center resonant frequency was 936.497 Mhz.

The structure of FIG. 4 (having 6 long runs 46 as opposed to the 7 shown in FIG. 4) was fabricated with a gold back plane. The circuit was fabricated from thallium superconductor on lanthanum aluminate. The unloaded Q was measure as 7,647. The center frequency was measured as 1,315.53 MHz.

The double coil inductor structure of FIG. 5 was tested and provided an unloaded Q of 2,435. Gold was used as a back plane material. The center frequency was 773.43 MHz.

The asymmetric single coil inductor structure of FIG. 7 provided an unloaded Q of 2,632. Gold provided the back plane. The center frequency was 1,039.97 MHz.

Although the foregoing invention has been described in some detail by way of illustration and example for purposes of clarity and understanding, it will be readily apparent to those of ordinary skill in the art in light of the teachings of this invention that certain changes and modifications may be made thereto without departing from the spirit or scope of the appended claims.

We claim:

1. An electrical circuit comprising:

a first substrate having a first face and a second face, a superconducting lumped element disposed on the first face, and a first ground plane disposed on the second face, a second substrate having a first face and a second face, a second superconducting lumped element disposed on the first face of the second substrate, a second ground plane disposed on the second face of the second substrate, the second lumped element disposed on the second substrate located in facing opposition to, and without direct electrical connection to, the first lumped element disposed on the first substrate.

2. The electrical circuit of claim 1 wherein a dielectric is located between said first and second substrates.

3. The electrical circuit of claim 2 wherein the dielectric is selected from the group consisting of: lanthanum aluminate, sapphire, magnesium oxide, metal fluoride, spinel, ceria, strontium titanate, barium titanate and polyimide.

4. A method for reducing radiative losses in a high Q, lumped element device, the device including an inductor, the inductor being adapted to carry current through the inductor, the inductor including a plurality of substantially parallel runs connected in series, the method comprising the steps of:

generating a current at or above the radio frequency range in the lumped element device, flowing the current through a first of the runs in a first direction, flowing the current in a substantially opposite direction to the first direction in the run adjacent the first run, and repeating the change in current direction for each succeeding run, characterized in that when the inductor is included with a capacitive element in a resonant circuit, the resonant circuit has a Q of at least 1,000.

5. The method for reducing radiative losses of claim 4 wherein the generating step consists of generating a current in the microwave range.

6. The method for reducing radiative losses of claim 5 wherein the generating step consists of generating a current of at least 800 MHz.

7. A method for reducing radiative losses in a high frequency, high Q, lumped element device, the device including an inductor and a capacitive element, the inductor being disposed on a support, the inductor adapted to carry high frequency current at or above the radio frequency range through the inductor, the method comprising the steps of:

forming a plurality of substantially parallel long runs on the support and connecting the long runs to adjacent long runs by end portions thereof so as to form a continuous serpentine pattern for the inductor, and flowing the high frequency current at or above the radio frequency range through the inductor, the current flowing in adjacent long runs in opposite directions, thereby reducing radiative losses.

8. The method for reducing radiative losses in claim 7 comprising carrying high frequency current of at least 800 MHz.

9. The method for reducing radiative losses in claim 7 wherein the lumped element device has a Q of at least 1,000.

10. An electrical element comprising:

a substantially non-magnetic substrate having a first face, and a high temperature superconducting lumped inductor having a zig-zag pattern disposed on the first face, the superconducting lumped inductor being epitaxial to the substrate in that the superconducting lumped inductor has a crystalline orientation which is fixed in relationship to the substrate.

11. An electrical LC circuit comprising:

a substrate, a capacitor having first and second plates, each plate being disposed on the substrate, the first and second plates being spaced apart to define a gap therebetween, and an inductor disposed on the substrate having a first end thereof connected to the second plate of the capacitor, the inductor having at least one turn passing through the gap, and a terminal end thereof connected to said at least one turn.

12. The electrical LC circuit of claim 11 further comprising a second capacitor having a first plate and a second plate, wherein the first plate of the second capacitor is disposed on the substrate and connected to the terminal end of the inductor.

13. The electrical LC circuit of claim 12 wherein the first and second plates of the second capacitor are both disposed on the substrate and are spaced apart to define a gap therebetween, and further comprising a second inductor, the second inductor having a first end thereof connected to the second plate of the second capacitor, the second inductor having at least one turn passing through the gap of the second capacitor, and a terminal end thereof connected to said at least one turn of the second inductor.

14. The electrical LC circuit of claim 12 wherein the inductor includes at least one turn encircling the first plate of the second capacitor.

15. The electrical LC circuits of claim 11 further comprising a ground plane disposed on the substrate.

16. The electrical LC circuit of claim 11 wherein the inductor comprises a high temperature superconductor.

17. An electrical LC circuit comprising:

a substrate, a parallel plate capacitor having a first plate and a second plate, wherein the first plate is displaced from the substrate and the second plate is disposed on the substrate, an inductor disposed on the substrate, the inductor being connected to the second plate of the capacitor and having at least one turn encircling the second plate of the capacitor, and said inductor having a terminal end thereof connected to said at least one turn.

18. The electrical LC circuit of claim 17 further comprising a second inductor connected to the first plate of the capacitor.

19. The electrical LC circuit of claim 17 further comprising a second parallel plate capacitor having a first and a second plate, wherein the second plate of the second parallel plate capacitor is disposed on the substrate, the terminal end of the inductor being connected to the second plate of the second parallel plate capacitor.

20. The electrical LC circuit of claim 19 wherein the inductor includes at least one turn encircling the second plate of the second parallel plate capacitor.

21. A lumped element inductor comprising:

a support having a first face, and a superconductive serpentine conductor having low loss in at least the radio frequency range disposed epitaxially on the support in that the conductor has a crystalline orientation which is fixed in relationship to the support, the serpentine conductor including:

an input, a plurality of substantially parallel long runs having respective ends and including a first long run and a last long run, the input being connected to the first of the long runs, a plurality of end portions, the end portions thereof respectively connecting in series the corresponding ends of adjacent long runs, and an output connected to the last long run.

22. A resonant circuit comprising:

a lumped element inductor further comprising:

a support having a first face, and a superconductive serpentine conductor having low loss in the microwave and radio frequency range disposed on the first face of the support, the serpentine conductor including:

an input, a plurality of substantially parallel long runs having respective ends and including a first long run and a last long run, the input being connected to the first of the long runs, a plurality of end portions, the end portions thereof respectively connecting in series the corresponding ends of adjacent long runs, and an output connected to the last long run, and a capacitor operatively connected to the lumped element inductor to define a resonant circuit having a Q in excess of 1,000.

23. The resonant circuit of claim 22 wherein the support includes a second face and a ground plane disposed on said second face of the support.

24. The resonant circuit of claim 22 wherein the lumped element inductor is a thallium containing superconductor composition.

25. The resonant circuit of claim 24 wherein the thallium containing superconductor composition is $Tl_2Ca_1Ba_2Cu_2O_8$.

26. The resonant circuit of claim 22 wherein the high temperature superconductor is epitaxial to the support in that the conductor has a crystalline orientation which is fixed in relationship to the support.

27. The resonant circuit of claim 22 wherein the serpentine conductor of the lumped element inductor is a YBCO superconductor composition.

28. The resonant circuit of claim 22 wherein the support comprises a dielectric selected from the group of dielectrics consisting of: lanthanium aluminate, sapphire, and magnesium oxide.

29. The resonant circuit of claim 22 wherein the support is a substantially non-magnetic substrate.

30. An electrical resonant circuit comprising:
   a substantially non-magnetic substrate having a first face, and
   a high temperature superconducting lumped inductor having a zig-zag pattern disposed on the first face, the inductor being coupled to a capacitive element and configured into a resonant circuit having a Q in excess of 1000.

31. The electrical resonant circuit of claim 30 wherein the substrate is selected from the group of non-magnetic dielectrics consisting of: lanthanium aluminate, sapphire, and magnesium oxide.

32. The electrical resonant circuit of claim 30 wherein the substrate includes a second face and further includes a ground plane disposed on the second face.

33. The electrical resonant circuit of claim 30 wherein the superconducting lumped inductor is epitaxial to the substrate in that the superconducting lumped inductor has a crystalline orientation which is fixed in relation to the substrate.

34. The electrical resonant circuit of claim 30 wherein the high temperature superconducting lumped inductor is a thallium containing superconductor composition.

35. The electrical resonant circuit of claim 34 wherein the thallium containing superconductor composition is $Tl_2Ca_1Ba_2Cu_2O_8$.

* * * * *

UNITED STATES PATENT AND TRADEMARK OFFICE
CERTIFICATE OF CORRECTION

PATENT NO.   :   5,618,777
DATED        :   April 8, 1997
INVENTOR(S)  :   Hey-Shipton et al.

It is certified that error appears in the above-identified patent and that said Letters Patent is hereby corrected as shown below:

Column 1, line 4, insert

--FEDERAL GOVERNMENT RIGHTS

This invention was made with Government support under Grant Number N00014-91-C-0126 awarded by the Department of the Navy. The Government has certain rights to this invention.--

Signed and Sealed this

Twenty-third Day of February, 1999

Attest:

Q. TODD DICKINSON

Attesting Officer

Acting Commissioner of Patents and Trademarks